United States Patent [19]

Chen et al.

[11] Patent Number: 5,652,733
[45] Date of Patent: Jul. 29, 1997

US005652733A

[54] COMMAND ENCODED DELAYED CLOCK GENERATOR

[75] Inventors: Lidong Chen, Nepean; Bruce Millar, Stittsville, both of Canada

[73] Assignee: Mosaid Technologies Inc., Kanata, Canada

[21] Appl. No.: 638,812

[22] Filed: Apr. 29, 1996

[51] Int. Cl.$^6$ ...................................................... G11C 8/00
[52] U.S. Cl. ........................... 365/233; 395/432; 395/438; 395/494; 395/500; 365/194; 365/230.08
[58] Field of Search ...................................... 365/194, 233, 365/230.08

[56] References Cited

U.S. PATENT DOCUMENTS 5,521,878  5/1996  Ohtani et al. ..................... 365/230.08
5,526,316  6/1996  Lin ........................................... 365/233
5,530,677  6/1996  Grover et al. ........................... 365/194
5,532,961  7/1996  Mori et al. .............................. 365/194

*Primary Examiner*—Joseph E. Clawson, Jr.
*Attorney, Agent, or Firm*—Pascal & Associates

[57] ABSTRACT

A clock feeding circuit to a semiconductor memory wherein the memory is comprised of separate independent control circuits each requiring a clock signal, comprising apparatus for receiving a control signal applied to one of the control circuits, and apparatus for applying a clock signal to the one of the independent control circuits, restricted to the one of the independent control circuits.

7 Claims, 3 Drawing Sheets

COMMAND ENCODED DELAYED CLOCK GENERATOR

FIELD OF THE INVENTION

This invention relates to a clock circuit for a semiconductor memory, and in particular to a clock delay circuit which is useful for synchronous dynamic random access memories (SDRAMs).

BACKGROUND TO THE INVENTION

An SDRAM is a conventional dynamic random access memory (DRAM) that has a synchronous interface. In the interface, external signals are latched by synchronizers at the rising edge of a clock signal, and are decoded to generate commands. Since it takes typically 2 to 3 nanoseconds for the latched signal to travel to the control circuits and to the x- or y-(column or row address) predecoders, the clock signal that triggers these control signals must be delayed with respect to the clock triggering the synchronizers. The delayed clock signal is generally referred to as DCLK and the undelayed clock signal is referred to as CLK.

DCLK is usually generated by a delay circuit, to which CLK is applied. The delay circuit is comprised of a delay chain and an output buffer, from which DCLK is received. When the number of SDRAM memory cells is not very large, and the operation frequency is not very high, this DCLK generator has worked well, and has the advantage of simplicity.

However, more recent SDRAMs are comprised of a much larger number of cells, for example 16 Mbits or larger, and work at high speed, for example 200 MHz or higher. The number of flip flops required in the control circuits for the SDRAM and in the address predecoders of the SDRAM becomes very large for SDRAMs having a large number of cells. This results in flip-flop gate capacitance and the routing wiring capacitance becoming large, which appears as a load on the clock signal. Since the AC power dissipation consumed by the clock signal is proportional to the capacitance in accordance with the formula $P_{AC}=C_{load}V^2f_c$, where $f_c$ represents the clock frequency, $C_{load}$ represents the capacitance to be fed and V represents the voltage, it can be seen that the increased frequency of high speed SDRAMs as well as high cell count results in large AC power dissipation.

Thus it has been shown that a 200 MHz 16 Mbit SDRAM will consume more than 50 mA of current only for the DCLK buffer and the flip-flops clocked by DCLK, if the simple DCLK generator is used. This has made the simple DCLK generator scheme impractical to use.

Instead of the simple DCLK generator, a pulse generator can be used, followed by a latch instead of flip-flops. This reduces the number of flip-flops, but also results in the risk of the generation of glitches.

Another option is to lower the clock frequency, but this destroys the benefits of the high speed capability of such SDRAMs.

SUMMARY OF THE INVENTION

The present invention utilizes the fact that some of the flip-flops in the memory control circuits and in the address predecoders are idle under certain command states. It has been found that it is possible to supply DCLK to only the control circuits that are commanded, and to not supply DCLK to those control circuits that are idle. As a result, the capacitance only of the flip-flops in the control circuits that are commanded active, as well as the ancillary wiring, form the DCLK load (other than other circuits used in the memory, of course). The result is that the high speed of the SDRAM can be maintained, with substantially reduced power dissipation.

In accordance with an embodiment of the present invention a clock feeding circuit to a semiconductor memory wherein said memory is comprised of separate independent control circuits each requiring a clock signal is comprised of apparatus for receiving a control signal applied to one of said control circuits, and apparatus for applying a clock signal to that one of the independent control circuits, restricted to that one of the independent control circuits.

In accordance with another embodiment, a delayed clock generator is comprised of apparatus for receiving memory command signals which are the same command signal for application to a semiconductor memory, apparatus for receiving an input clock signal, apparatus for generating a plurality of delayed clock signals from the input clock signal, and apparatus for providing specific ones of the delayed clock signals to specific parts of said memory commanded by the command signals, upon reception of corresponding ones of the command signals commanding the specific parts of said memory.

BRIEF INTRODUCTION TO THE DRAWINGS

A better understanding of the invention will be obtained by considering the detailed description below, with reference to the following drawings, in which.

DETAILED DESCRIPTION OF THE PREFERRED EMBODIMENT

Figure 1:
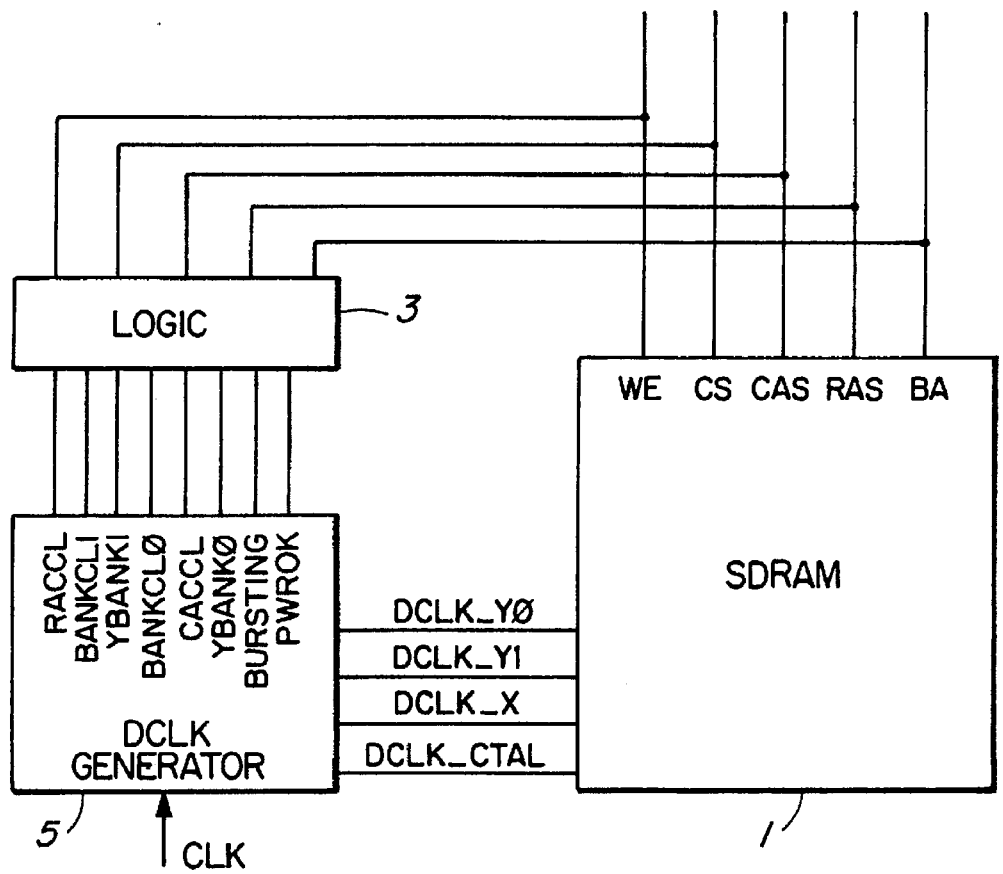
FIG. 1 is a basic block diagram of the invention.

FIG. 1 illustrates a block diagram of the invention. A representative semiconductor memory, illustrated as SDRAM 1, has various well known signals applied thereto, e.g. /RAS (row address strobe), /CAS column (address strobe), /WE (write enable), /CS (chip select) and BA (bank access), on the lines leading to the correspondingly labeled inputs. In accordance with the present invention, these same signals are applied to a command decoder and control logic (labeled as LOGIC 3 circuit in the figure). The LOGIC circuit is connected to a delayed clock generator DCLK Generator 5, applying the signals RACCL, BANKCL, YBANK, BANKCL0, CACCL, YBANK0, BURSTINC and PWROK (to be described in more detail below) to the DCLK Generator 5.

The DCLK generator generates delayed clock signals to be applied to the various control circuits and address predecoders of the SDRAM, DCLK_Y0 for one bank of y-predecoders of the SDRAM, DCLK_Y1 for another bank of y-predecodrs of the SDRAM, DCLK_X for the x-predecoders and DCLK_CTRL which is a constantly running delayed clock for parts of the SDRAM including control circuits which require a constant delayed clock signal.

Thus when a row command (/RAS=low) is received, a DCLK is required only to trigger the row control circuits and x-predecoders, and the flip-flops in the column control circuits and the y-predecoders do not require a clock signal.

The logic 3 and DCLK generator 5 detects the/ROW command, delays the input CLK signal and applies a delayed clock signal DCLK_X to the corresponding delayed clock input of the SDRAM. It also applies a constant delayed clock signal DCLK_CTRL to the corresponding input of the SDRAM.

Similarly, when a column command (/CAS=low) is received, a DCLK is generated to trigger the column control circuits and y-predecoders and lasts for a period of time determined by the burst length. In the example given, two banks of column control circuits are assumed, and the delayed clock signals DCLK_Y0 and DCLK_Y1 are generated and applied to the corresponding inputs of the SDRAM.

The states of the commands enable various DCLKs to be generated and separately applied to various delayed clock inputs of the SDRAM specifically to its real need, as will be indicated later with respect to a truth table.

Figure 2:
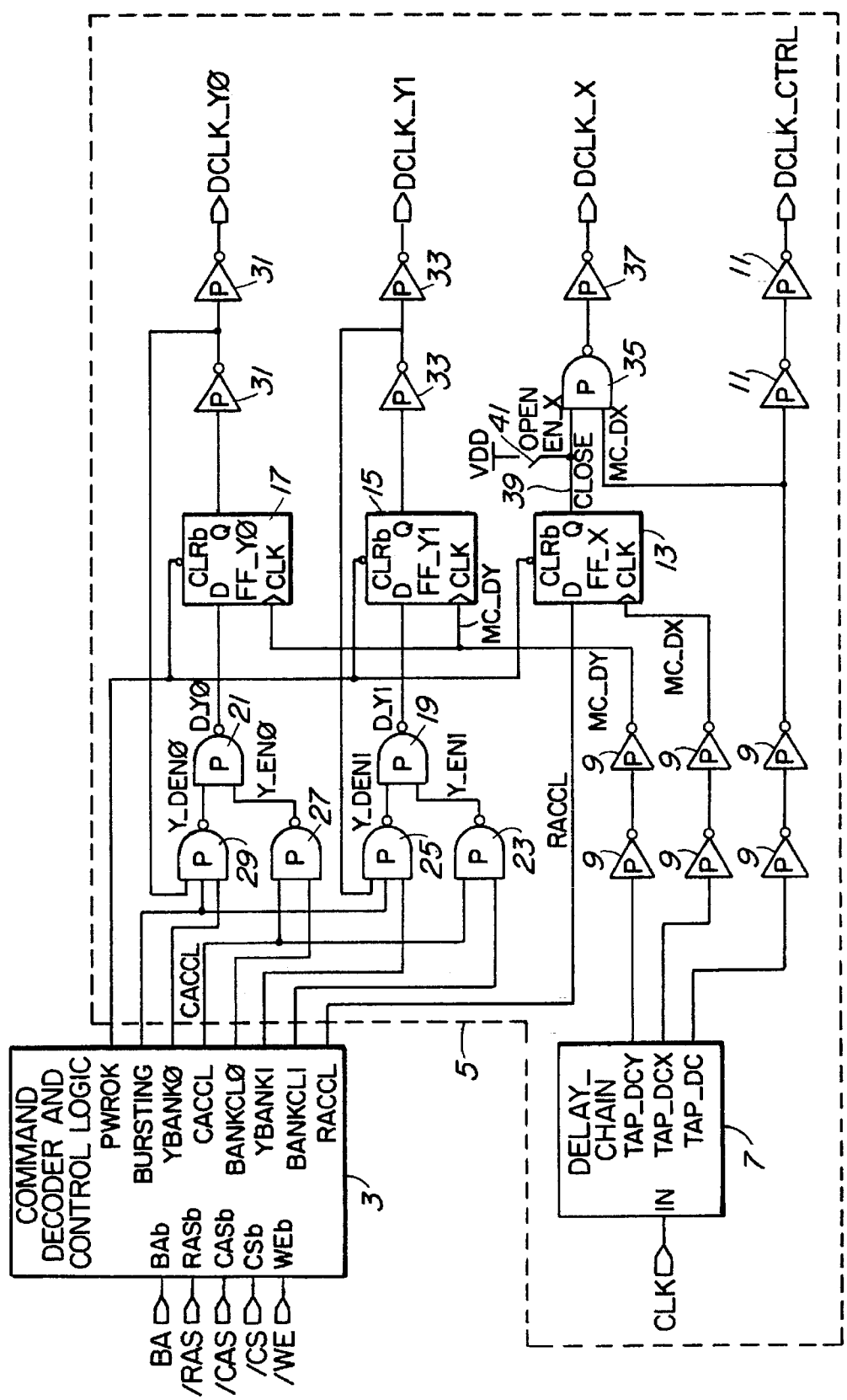
FIG. 2 is a schematic diagram of an embodiment of the invention.

An embodiment of the invention will now be described with reference to FIG. 2, which illustrates LOGIC 3, and DCLK generator 5 within a dashed line block. The inputs to LOGIC 3 are represented by the aforenoted control signals, and the inputs and outputs of the DCLK generator 5 are represented by the signal identities described earlier.

An input clock CLK is applied to a delay chain circuit 7, which provides delayed signals TAP_DCY, TAP_DCX and TAP_DC, having relative delay characteristics as will be described further below. Each of these delayed signals are applied through a pair of serially connected inverters 9. The output of the inverters 9 which pass the TAP_DC signal is applied through a pair of inverters 11, to a DCLK_CTRL signal output. The DCLK_CTRL signal is a constantly running (constant) delayed version of the input CLK, for application to the SDRAM and in particular control circuits therefore which require a constant delayed clock.

The output signal of the inverters 9 which carry the TAP_DCX signal, labeled MC_DX, is applied to the CLK input of a flip-flop FF_X 13, and the output signal of the inverters 9 which carry the TAP_DCY signal, labeled MC_DY, is applied to the CLK inputs of both flip-flop FF_Y1 and FF_Y0, 15 and 17. The CLR inputs of each of the flip-flops 13, 15 and 17 are connected to the PWROK output of LOGIC 3. The D input of flip-flop 13 is connected to the RACCL output of LOGIC 3. The D inputs of flip-flops 15 and 17 are connected to the outputs of respective NAND gates 19 and 21. The inputs of NAND gate 19 are connected to the outputs of NAND gates 23 and 25, and the inputs of NAND gate 21 are connected to the outputs of NAND gates 27 and 29.

The two of the inputs of NAND gate 23 are connected to the respective outputs CACCL and BANCKCL1 of LOGIC 3; two of the inputs of NAND gate 25 are connected to the respective outputs YBANK1 and BURSTINC of LOGIC 3, the two inputs of NAND gate 27 are connected to the outputs CACCL and BANKCL0 of LOGIC 3, and two of the inputs of NAND gate 29 are connected to the BURSTINC and YBANK0 outputs of LOGIC 3.

The Q output of flip-flop 17 is connected via a pair of serially connected inverters 31 to an output to provide the signal DCL_Y0. The Q output of flip-flop 15 is connected via a pair of serially connected inverters 33 to an output to provide the signal DCLK_Y1. The junction of inverters 31 is connected to another input of NAND gate 29, and the junction of inverters 33 is connected to another input of NAND gate 25.

The output of flip-flop 13 is connected to an input of NAND gate 35, the output of which is connected via inverter 37 to an output to provide the signal DCLK_X. The other input of NAND gate 35 is connected to the junction of inverter 9 and inverter 11.

Figure 3:
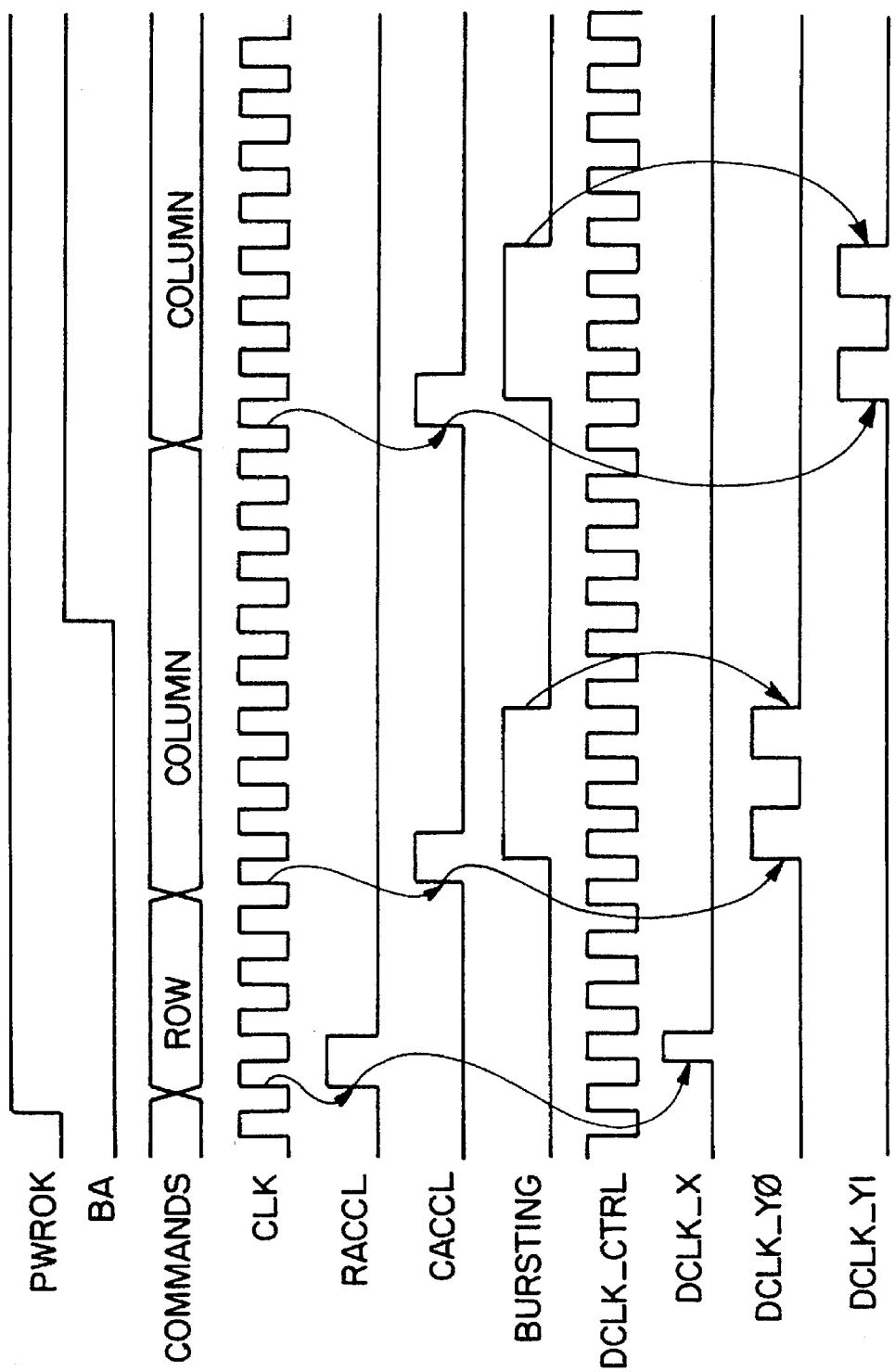
FIG. 3 is a timing diagram of signals appearing in the described embodiment.

LOGIC 3 with the above-identified DCLK generator 5 operates to provide the aforenoted signals in accordance with the following truth table, with the timing shown in FIG. 3. The example is given with dual bank operation, but it will be recognized that this could be modified to provide single bank or additional bank operation if desired. The logic design of LOGIC 3 would be well within the skill of a person skilled in the art understanding the truth table and could be of various forms, and therefore a detailed design description herein is considered to be redundant.

| /CS | /RAS | /CAS | /WE | BA | Clocks | $f_{DCLK}$ | Control Signals |
|---|---|---|---|---|---|---|---|
| H | X | X | X | X | Disable | 0 | don't care |
| L | X | X | X | X | DCLK_CTRL | fCLK | don't care |
| L | L | H | X | X | DCLK_X | One Pulse | RACCL high |
| L | H | L | X | L | DCLK_Y0 | $f_{CLK}/2$ | CACCL high, BANKCL0 high |
| L | H | L | X | H | DCLK_Y1 | $f_{CLK}/2$ | CACCL high, BANKCL1 high |

Delayed CLK signals are generated and delayed by delay chain 7 and inverters 9 from CLK. One of these signals, as described earlier, is applied through inverters 11 to provide the constant DCLK_CTRL signal.

Another of these signals is applied to the CLK input of flip-flop 13, and the other is applied to the CLK inputs of flip-flops 15 and 17. However, the D inputs to the latter flip-flops receive signals resulting from the truth table combinations, to provide the DCLK_X, DCLK_Y0 and DCLK_Y1 delayed clock signals noted above, to be applied to the x-predecoders, and bank 0 and bank 1 y-predecoders of the SDRAM respectively.

Since the x-predecoders of the SDRAM need only be clocked when a row operation command (row activation or precharge) is issued, the DCLK to the X-predecoders is enabled for one pulse when a/RAS signal is received.

The enable RACCL (clocked row active) signal to the flip-flop 13 is generated from the command decoding circuit in accordance with the truth table.

In y-predecoders, the flip flops that receive DCLK operate at half the frequency of CLK, and only operate when a column command is received. Frequency dividers are used to generate the signals DCLK_Y0 and DCLK_Y1 (the feedback connection between the junction of inverters 31 and flip-flop 17, and the feedback connection between the junction of inverters 33 and flip-flop 15). These signals control the flip-flops in bank 0 and bank 1 respectively of the predecoders of the SDRAM. The flip-flops 15 and 17 are enabled by the encoded column command CACCL and the bank select signals BANKCL0 and BANKCL1, and are disabled by the signals BURSTING (when a burst ends) and the column control signals YBANK0 and YBANK1.

All of the flip-flops 13, 15 and 17 are reset by the PWROK (power level is satisfactory) signal going to low logic level.

FIG. 3 illustrates the relative timing of the various signals referred to above. With the PWROK signal going high, and CLK running, upon receipt of a row command the LOGIC 3 generates a row command present signal RACCL pulse for one complete CLK period. This signal is applied to the D input of flip-flop 13. This flip-flop outputs a signal through NAND gate 35 and inverter 37 resulting in the DCLK_X pulse which is coincident with the delayed clock signal DCLK_CTRL.

Similarly, when either column command is generated, at the next rising edge of CLK a CACCL pulse is generated in LOGIC 3. This is applied via NAND gates 23 and 27, and NAND gates 19 and 21, to flip-flops 15 and 17. Depending on whether the column command caused the BANKCL0 or BANKCL1 to be generated, either flip-flop 15 or flip-flop 17 is operated, causing eithr DCLK_Y0 or DCLK_Y1 pulses to be generated at ½ the frequency of CLK, in synchronism with the BURSTING signal. These pulses are terminated by the end of the BURSTING signal.

To take care of the cases in which the setup or hold times for the flip-flop 13 are too small and flip-flop 13 does not operate, option switches can be used to make the DCLK_X signal the same as the DCLK_CTRL signal. This is provided by inserting switch 39 in series with the output of flip-flop 13 to an input of NAND gate 35, and bypassing that same NAND gate input to a voltage such as VDD by a switch 41. For the normal operation as described earlier, switch 39 is closed and switch 41 is open. In the latter case, switch 39 is open and switch 41 is closed.

In operation in the latter case, the NAND gate 35 receives its input from the junction of inverters 9 and 11, and outputs a signal in synchronism with DCLK_CTRL.

The clocks triggering the flip-flops 13, 15 and 17 are delayed clocks with delays having a predetermined delay, of timing CLK and DCLK, provided in delay chain 7.

In order to minimize any differences between the rising edges of DCLK_, DCLK_X and DCLK_Y0 or DCLK_Y1, output signals of the delay chain, labeled TAP_DCX and TAP_DCY should be set correctly relative to TAP_DC from the clock delay chain. The delay between TAP_DCY and TAP_DC should be the propagation delay of the flip-flop 15 or 17. The delay between TAP_DCX and TAP_DC should be the propagation delay of the flip-flop 13 plus the timing margin between the signals EN_X and MC_DX (outputs of inverters 9). The actual delays between TAP_DCX and TAP_DC and between TAP_DCY and TAP_DC can be accurately determined by analog simulation.

Figure 4:
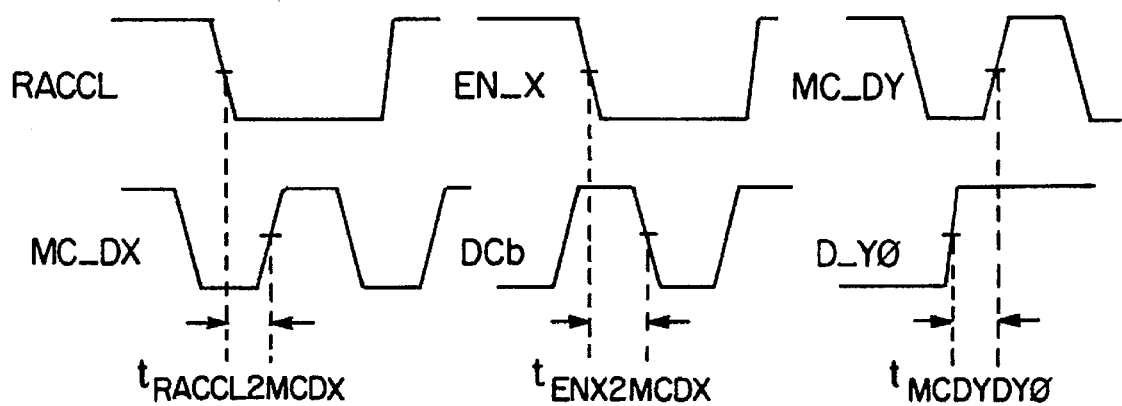
FIG. 4 is a timing diagram of signals appearing in the described embodiment showing timing margins.

In addition, several timing margins for the signals input to or output from the flip-flops 13, 15 and 17 should be established. Those margins are illustrated between the vertical dashed lines of signals in FIG. 4. Timing margin $t_{RACCLMCDX}$ is the setup time for the flip flop 13, and $t\_ENX2MCDX$ is the setup time for the NAND gate connected to flip-flop 13. Since the time interval between the decoded commands and DCLK_CTRL is fixed and equal to the propagation delay of flip-flop $13+t_{RACCL2MCDX}+t_{ENX2MCDX}$, the two timing margins act against one another. If one of them becomes too small to generate DCLK_X, the option switches 39 and 41 can be used to enable the NAND gate 35, as described earlier, to make DCLK_X the same as DCLK_CTRL. The setup time $t_{RACCL2MCDX}$ or $t_{ENX2MCDX}$ is the setup time for the flip-flop 15 or 17, and would be typically large enough to keep flip flop 15 or 17 operating.

While the present invention has been described with reference to an SDRAM, it will be understood that its principles can be applied to any semiconductor memory having similar problems or other problems solved thereby.

A person understanding this invention may now conceive of alternative structures and embodiments or variations of the above. All those which fall within the scope of the claims appended hereto are considered to be part of the present invention.

We claim:

1. A clock feeding circuit to a semiconductor memory wherein said memory is comprised of separate independent control circuits each requiring a clock signal, comprising means for receiving a control signal applied to one of said control circuits, and means for applying a clock signal to said one of the independent control circuits, restricted to said one of the independent control circuits.

2. A clock feeding circuit as defined in claim 1 in which said control circuits are column and row predecoders.

3. A clock feeding circuit as defined in claim 2 further comprising means for applying a constant clock signal to circuits of said memory requiring said constant clock signals, but restricting application of the constant clock signals from application to other ones of said independent control circuits.

4. A clock feeding circuit as defined in claim 3 including means for providing each of the clock signals as delayed clock signals from an input clock signal.

5. A delayed clock generator comprising:

(a) means for receiving memory command signals which are the same command signals for application to a semiconductor memory, (b) means for receiving an input clock signal, (c) means for generating a plurality of delayed clock signals from the input clock signal, (d) means for providing specific ones of said delayed clock signals to specific parts of said memory commanded by said command signals, upon reception of corresponding ones of said command signals commanding said specific parts of said memory.

6. A delayed clock generator as defined in claim 5 including further means for providing a delayed constant clock signal for application to a delayed clock input of said memory.

7. A delayed clock generator as defined in claim 6 in which said memory is a synchronous dynamic random access memory (SDRAM) in which the control signals are /CS, /RAS, /CAS, /WE and BA, and in which the providing means generate delayed clock signals in accordance with the following truth table:

| /CS | /RAS | /CAS | /WE | BA | Clocks    | $f_{DCLK}$    |
|-----|------|------|-----|----|-----------|---------------|
| H   | X    | X    | X   | X  | Disable   | 0             |
| L   | X    | X    | X   | X  | DCLK_CTRL | fCLK          |
| L   | L    | H    | X   | X  | DCLK_X    | One Pulse     |
| L   | H    | L    | X   | L  | DCL K_Y0  | $f_{CLK}/2$   |
| L   | H    | L    | X   | H  | DCLK_Y1   | $f_{CLK}/2$   | where DCLK_CTRL is the delayed constant clock signal,

DCLK_X is a delayed clock for application to x-predecoders of the SDRAM,

DCLK_Y0 is a delayed clock for application to one bank of y-predecoders of the SDRAM, DCLK_Y1 is a delayed clock for application to another bank of y-predecoders of the SDRAM, fDCLK is the frequency of the delayed clock signal, and fCLK is the frequency of the input clock signal.

* * * * *